(12) United States Patent
Li

(10) Patent No.: US 10,043,473 B2
(45) Date of Patent: Aug. 7, 2018

(54) GOA CIRCUIT

(71) Applicant: Wuhan China Star Optoelectronics Technology Co., Ltd., Wuhan (CN)

(72) Inventor: Yafeng Li, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 131 days.

(21) Appl. No.: 15/128,420

(22) PCT Filed: Aug. 30, 2016

(86) PCT No.: PCT/CN2016/097305
§ 371 (c)(1),
(2) Date: Sep. 22, 2016

(87) PCT Pub. No.: WO2018/028008
PCT Pub. Date: Feb. 15, 2018

(65) Prior Publication Data
US 2018/0182334 A1  Jun. 28, 2018

(30) Foreign Application Priority Data
Aug. 8, 2016  (CN) .......................... 2016 1 0642893

(51) Int. Cl.
*G09G 3/36* (2006.01)
(52) U.S. Cl.
CPC ... *G09G 3/3674* (2013.01); *G09G 2310/0283* (2013.01)

(58) Field of Classification Search
CPC ... G09G 3/36; G09G 3/30; G09G 5/00; G11C 19/00; G02F 1/1345; G06F 3/038
See application file for complete search history.

(56) References Cited

U.S. PATENT DOCUMENTS

| | | | |
|---|---|---|---|
| 2010/0158187 A1* | 6/2010 | Moon | G09G 3/3266 377/76 |
| 2013/0335367 A1* | 12/2013 | Kim | G09G 3/3696 345/174 |
| 2016/0189647 A1* | 6/2016 | Xiao | G09G 3/3677 345/92 |
| 2016/0351156 A1* | 12/2016 | Wu | G11C 19/28 |

FOREIGN PATENT DOCUMENTS

CN         205080895 U       3/2016

\* cited by examiner

*Primary Examiner* — Pegeman Karimi
(74) *Attorney, Agent, or Firm* — Leong C. Lei

(57) ABSTRACT

The invention provides a GOA circuit, the forward-and-reverse scan control module of the GOA circuit comprising: a first TFT and a third TFT, the first TFT having the gate connected to the gate scan drive signal of the (n−1)-th GOA unit, the source connected to the first constant voltage, and the drain connected to a first node; and the third TFT having the gate connected to the gate scan drive signal of the (n+1)-th GOA unit, the source connected to the first constant voltage, and the drain connected to the first node. With the two TFTs to control the switching of forward and reverse scanning of the GOA circuit, the present invention eliminates two control signals without increasing the numbers of TFTs and capacitors. As such, the selection for IC is increased, which enables the realization of narrow border LCD.

13 Claims, 6 Drawing Sheets

GOA CIRCUIT

BACKGROUND OF THE INVENTION

1. Field of the Invention

The present invention relates to the field of display, and in particular to a gate driver on array (GOA) circuit.

2. The Related Arts

As the liquid crystal display (LCD) shows the advantages of being thin, low power-consumption, and no radiation, the LCD is widely used in various devices, such as, liquid crystal TV, mobile phones, PDA, digital camera, PC monitors or notebook PC screens as well as the leading technology in tablet PCs.

The gate driver on array (GOA) technology is the array substrate column drive technology, by using the array substrate process for the LCD panel to manufacture the driver circuit for the horizontal scan line in the area around the active area on the substrate to replace the external integrated circuit (IC) to perform driving the horizontal scan lines. GOA technology can reduce the bonding process for the external IC and reduce cost, as well as the ability to realize narrow-border or borderless panels, and is used by many types of displays.

Refer to FIG. 1. A known GOA circuit comprises: a plurality of cascade GOA units, with each GOA unit comprising: a forward-and-reverse scan control module 100, an output module 200 and a node control module 300; for a positive integer n, in the n-th stage GOA unit, the forward-and reverse scan control module 100 comprising: a first thin film transistor (TFT) T1, with the gate connected to the gate scan drive signal G(n−2) of the (n−2)-th stage GOA unit, the source connected to forward scan control signal U2D, and the drain connected to a first node H(n); and a third TFT, with the gate connected to the gate scan drive signal G(n+2) of the (n+2)-th stage GOA unit, the source connected to reverse scan control signal D2U, and the drain connected to a first node H(n); The output module 200 comprising: a second TFT T2, with the gate connected to the second node Q(n), the source connected to the m-th clock signal CK(m), and the drain connected to the gate scan drive signal G(n) of the n-th stage GOA unit, and a first capacitor C1, with one end connected to the second node Q(n), and the other end connected to the gate scan drive signal G(n) of the n-th stage GOA unit; the node control module 300 comprising: a fourth TFT T4, with the gate connected to a third node P(n), the source connected to the gate scan drive signal G(n) of the n-th stage GOA unit, and the drain connected to a constant low voltage VGL; a fifth TFT T5, with the gate connected to a constant high voltage VGH, the source connected to the first node H(n), and the drain connected to the second node Q(n); a sixth TFT T6, with the gate connected to the third node P(n), the source connected to the first node H(n), and the drain connected to the constant low voltage VGL; a seventh TFT T7, with the gate connected to the first node H(n), the source connected to the third node P(n), and the drain connected to the constant low voltage VGL; an eighth TFT T8, with the gate connected to the (m+2)-th clock signal CK(m+2), the source connected to the constant high voltage VGH, and the drain connected to the third node P(n); and a second capacitor C2, with one end connected to the third node P(n) and the other end connected to the constant low voltage VGL.

In the known GOA circuit in FIG. 1, the first TFT T1 and the third TFT T3 form the forward-and-reverse scan control module 100. The first TFT T1 and the third TFT T3 must be connected respectively to the forward scan control signal U2D and reverse scan controls signal D2U. During forward scanning, the forward scan control signal U2D is high and the reverse scan control signal D2U is low; during reverse scanning, the forward scan control signal U2D is low and the reverse scan control signal D2U is high. As such, the integrated circuit (IC) must provide the capability of outputting the control signals, which limits the selection range of the IC. Also, because of the existence of the forward scan control signal U2D and reverse scan controls signal D2U, the layout is difficult to realize narrow-border LCD.

SUMMARY OF THE INVENTION

The object of the present invention is to provide a GOA circuit, without the need to provide the forward scan control signal and the reverse scan control signal to realize the forward-and-reverse scan, enabling the realization of narrow border LCD.

To achieve the above object, the present invention provides a GOA circuit, which comprises: a plurality of cascade GOA units, each GOA unit comprising: a forward-and-reverse scan control module, an output module connected to the forward-and-reverse scan control module, a pull-down module connected to the output module, and a pull-down control module connected to the forward-and-reverse scan control module, the output module and the pull-down module; for a positive integer n and a positive number m, other than the GOA unit in the first and the last stages, in the n-th GOA unit, the forward-and-reverse scan control module being connected to receive a gate scan drive signal of the (n−1)-th GOA unit, a gate scan drive signal of the (n+1)-th GOA unit, and a first constant voltage, for outputting the first constant voltage to the output module based on the gate scan drive signal of the (n−1)-th GOA unit or the gate scan drive signal of the (n+1)-th GOA unit to control output module to achieve forward scanning or reverse scanning of the GOA circuit; the output module outputting an n-th gate scan drive signal during an operation duration of the n-th GOA unit; the pull-down module pulling down the voltage level of the n-th gate scan drive signal during a non-operation duration of the n-th GOA unit; and the pull-down control module shutting down the pull-down module and maintaining the output module turned on during the operation duration of the n-th GOA unit, and turning on the pull-down module and shutting down the output module during the non-operation duration of the n-th GOA unit.

The forward-and-reverse scan control module comprises: a first TFT, with the gate connected to the gate scan drive signal of the (n−1)-th GOA unit, the source connected to the first constant voltage, and the drain connected to a first node; and a third TFT, with the gate connected to the gate scan drive signal of the (n+1)-th GOA unit, the source connected to the first constant voltage, and the drain connected to the first node; the output module comprising: a second TFT, with the gate connected to a second node, the source connected to an m-th clock signal, and the drain connected to the gate scan drive signal of the n-th GOA unit; and a first capacitor, with one end connected to the second node and the other end connected to the gate scan drive signal of the n-th GOA unit; the pull-down module comprising: a fourth TFT, with the gate connected to a third node, the source connected to the gate scan drive signal of the n-th GOA unit, and the drain connected to a second constant voltage; and a second capacitor, with one end connected to the third node and the other end connected to the second constant voltage; the pull-down control module comprising: a sixth TFT, with the gate connected to the third node, the source connected to the first node, and the drain connected to the second constant voltage; a seventh TFT, with the gate connected to the first node, the source connected to the third node, and the drain connected to the second constant voltage; and an eighth TFT, with the gate connected to the (m+2)-th clock signal, the source connected to the first constant voltage, and the drain connected to the third node; the GOA unit further comprising a regulator module, which comprising a fifth TFT, with the gate connected to the first constant voltage, the source connected to the first node, and the drain connected to the second node; wherein the first constant voltage and the second constant voltage having opposite voltage levels.

In the first GOA unit, the gate of the first TFT is connected to a circuit activation signal.

In the last GOA unit, the gate of the third TFT is connected to a circuit activation signal.

The clock signals comprise four clock signals: a first clock signal, a second clock signal, a third clock signal and a fourth clock signal, when the m-th clock signal is the third clock signal, the (m+2)-th clock signal is the first signal; and when the m-th clock signal is the fourth clock signal, the (m+2)-th clock signal is the second signal.

The first, second, third and fourth clock signals have the same pulse cycle, and the falling edge of a previous clock signal is generated simultaneously with the rising edge of a next clock signal.

All the TFTs are of the N-type TFTs, the first constant voltage is a constant high voltage, and the second constant voltage is a constant low voltage.

All the TFTs are of the P-type TFTs, the first constant voltage is a constant low voltage, and the second constant voltage is a constant high voltage.

All the TFTs are of the amorphous silicon (a-Si) TFTs, low temperature polysilicon (LTPS) TFTs, or oxide semiconductor TFTs.

The present invention also provides a GOA circuit, which comprises: a plurality of cascade GOA units, each GOA unit comprising: a forward-and-reverse scan control module, an output module connected to the forward-and-reverse scan control module, a pull-down module connected to the output module, and a pull-down control module connected to the forward-and-reverse scan control module, the output module and the pull-down module; for a positive integer n and a positive number m, other than the GOA unit in the first and the last stages, in the n-th GOA unit, the forward-and-reverse scan control module being connected to receive a gate scan drive signal of the (n−1)-th GOA unit, a gate scan drive signal of the (n+1)-th GOA unit, and a first constant voltage, for outputting the first constant voltage to the output module based on the gate scan drive signal of the (n−1)-th GOA unit or the gate scan drive signal of the (n+1)-th GOA unit to control output module to achieve forward scanning or reverse scanning of the GOA circuit; the output module outputting an n-th gate scan drive signal during an operation duration of the n-th GOA unit; the pull-down module pulling down the voltage level of the n-th gate scan drive signal during a non-operation duration of the n-th GOA unit; and the pull-down control module shutting down the pull-down module and maintaining the output module turned on during the operation duration of the n-th GOA unit, and turning on the pull-down module and shutting down the output module during the non-operation duration of the n-th GOA unit; the forward-and-reverse scan control module comprising: a first TFT, with the gate connected to the gate scan drive signal of the (n−1)-th GOA unit, the source connected to the first constant voltage, and the drain connected to a first node; and a third TFT, with the gate connected to the gate scan drive signal of the (n+1)-th GOA unit, the source connected to the first constant voltage, and the drain connected to the first node; the output module comprising: a second TFT, with the gate connected to a second node, the source connected to an m-th clock signal, and the drain connected to the gate scan drive signal of the n-th GOA unit; and a first capacitor, with one end connected to the second node and the other end connected to the gate scan drive signal of the n-th GOA unit; the pull-down module comprising: a fourth TFT, with the gate connected to a third node, the source connected to the gate scan drive signal of the n-th GOA unit, and the drain connected to a second constant voltage; and a second capacitor, with one end connected to the third node and the other end connected to the second constant voltage; the pull-down control module comprising: a sixth TFT, with the gate connected to the third node, the source connected to the first node, and the drain connected to the second constant voltage; a seventh TFT, with the gate connected to the first node, the source connected to the third node, and the drain connected to the second constant voltage; and an eighth TFT, with the gate connected to the (m+2)-th clock signal, the source connected to the first constant voltage, and the drain connected to the third node; the GOA unit further comprising a regulator module, which comprising a fifth TFT, with the gate connected to the first constant voltage, the source connected to the first node, and the drain connected to the second node; wherein the first constant voltage and the second constant voltage having opposite voltage levels; in the first GOA unit, the gate of the first TFT being connected to a circuit activation signal; in the last GOA unit, the gate of the third TFT being connected to a circuit activation signal; and all the TFTs being of the amorphous silicon (a-Si) TFTs, low temperature polysilicon (LTPS) TFTs, or oxide semiconductor TFTs.

Compared to the known techniques, the present invention provides the following advantages: the present invention provides a GOA circuit, the forward-and-reverse scan control module of the GOA circuit comprising: a first TFT and a third TFT, the first TFT having the gate connected to the gate scan drive signal of the (n−1)-th GOA unit, the source connected to the first constant voltage, and the drain connected to a first node; and the third TFT having the gate connected to the gate scan drive signal of the (n+1)-th GOA unit, the source connected to the first constant voltage, and the drain connected to the first node. With the two TFTs to control the switching of forward and reverse scanning of the GOA circuit, the present invention eliminates two control signals without increasing the numbers of TFTs and capacitors. As such, the selection for IC is increased, which enables the realization of narrow border LCD.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
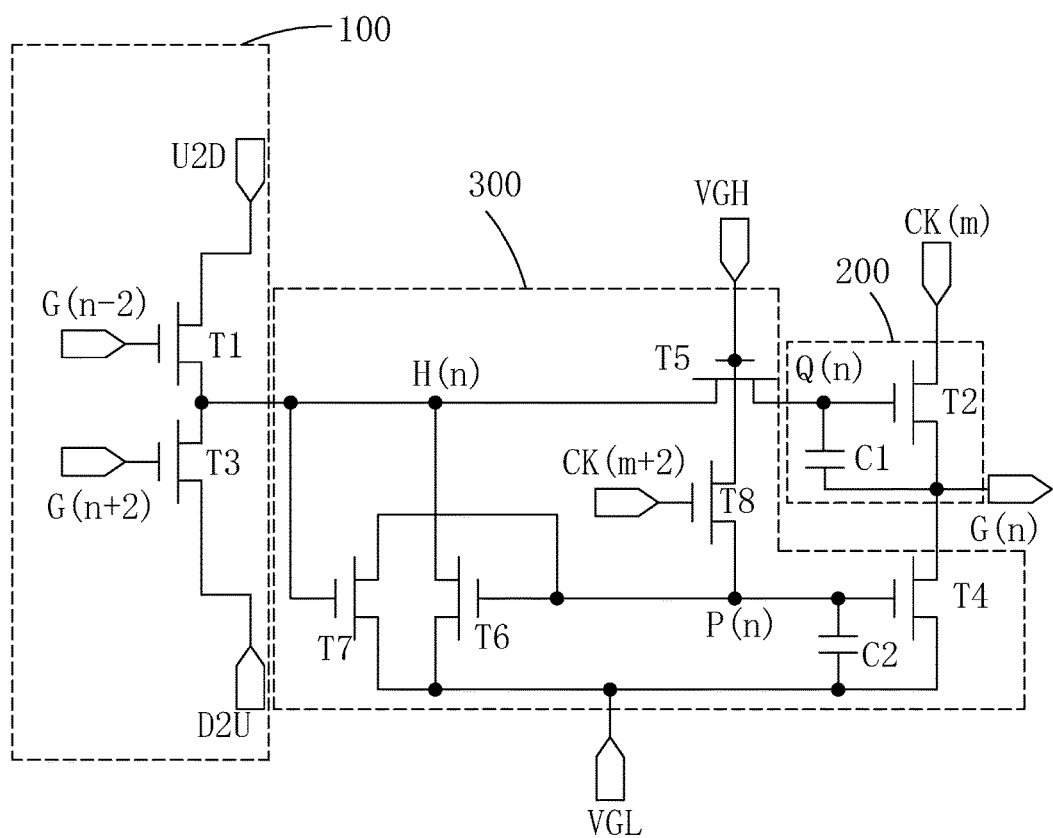
FIG. 1 is a schematic view showing a known GOA circuit.
Figure 2:
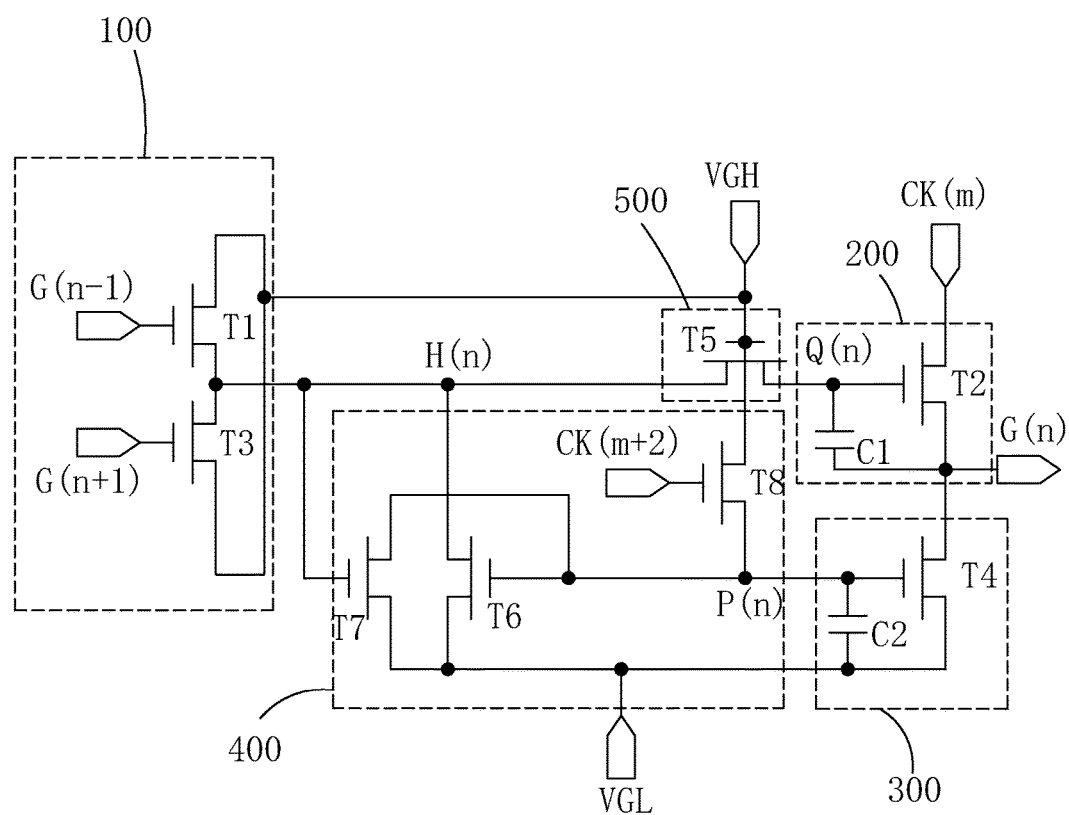
FIG. 2 is a schematic view showing the GOA circuit provided by an embodiment of the present invention.

Refer to FIG. 2. The present invention provides a GOA circuit, which comprises: a plurality of cascade GOA units, each GOA unit comprising: a forward-and-reverse scan control module 100, an output module 200 connected to the forward-and-reverse scan control module 100, a pull-down module 300 connected to the output module 200, and a pull-down control module 400 connected to the forward-and-reverse scan control module 100, the output module 200 and the pull-down module 300.

For a positive integer n and a positive number m, other than the GOA unit in the first and the last stages, in the n-th GOA unit, the forward-and-reverse scan control module is connected to receive a gate scan drive signal G(n−1) of the (n−1)-th GOA unit, a gate scan drive signal G(n+1) of the (n+1)-th GOA unit, and a first constant voltage, for outputting the first constant voltage to the output module 200 based on the gate scan drive signal G(n−1) of the (n−1)-th GOA unit or the gate scan drive signal G(n+1) of the (n+1)-th GOA unit to control output module to achieve forward scanning or reverse scanning of the GOA circuit.

The output module 200 outputs an n-th gate scan drive signal G(n) during an operation duration of the n-th GOA unit.

The pull-down module 300 pulls down the voltage level of the n-th gate scan drive signal G(n) during a non-operation duration of the n-th GOA unit.

The pull-down control module 400 shuts down the pull-down module 300 and maintains the output module 200 turned on during the operation duration of the n-th GOA unit, and turns on the pull-down module 300 and shuts down the output module 200 during the non-operation duration of the n-th GOA unit.

Specifically, the forward-and-reverse scan control module 100 comprises: a first TFT T1, with the gate connected to the gate scan drive signal G(n−1) of the (n−1)-th GOA unit, the source connected to the first constant voltage, and the drain connected to a first node H(n); and a third TFT T3, with the gate connected to the gate scan drive signal G(n+1) of the (n+1)-th GOA unit, the source connected to the first constant voltage, and the drain connected to the first node H(n).

The output module 200 comprises: a second TFT T2, with the gate connected to a second node Q(n), the source connected to an m-th clock signal CK(m), and the drain connected to the gate scan drive signal G(n) of the n-th GOA unit; and a first capacitor C1, with one end connected to the second node Q(n) and the other end connected to the gate scan drive signal G(n) of the n-th GOA unit.

The pull-down module 300 comprises: a fourth TFT T4, with the gate connected to a third node P(n), the source connected to the gate scan drive signal G(n) of the n-th GOA unit, and the drain connected to a second constant voltage; and a second capacitor C2, with one end connected to the third node P(n) and the other end connected to the second constant voltage.

The pull-down control module 400 comprises: a sixth TFT T6, with the gate connected to the third node P(n), the source connected to the first node H(n), and the drain connected to the second constant voltage; a seventh TFT T7, with the gate connected to the first node H(n), the source connected to the third node P(n), and the drain connected to the second constant voltage; and an eighth TFT T8, with the gate connected to the (m+2)-th clock signal CK(m+2), the source connected to the first constant voltage, and the drain connected to the third node P(n).

The GOA unit further comprises a regulator module 500, which comprises a fifth TFT T5, with the gate connected to the first constant voltage, the source connected to the first node H(n), and the drain connected to the second node Q(n).

The first constant voltage and the second constant voltage have opposite voltage levels.

Figure 3:
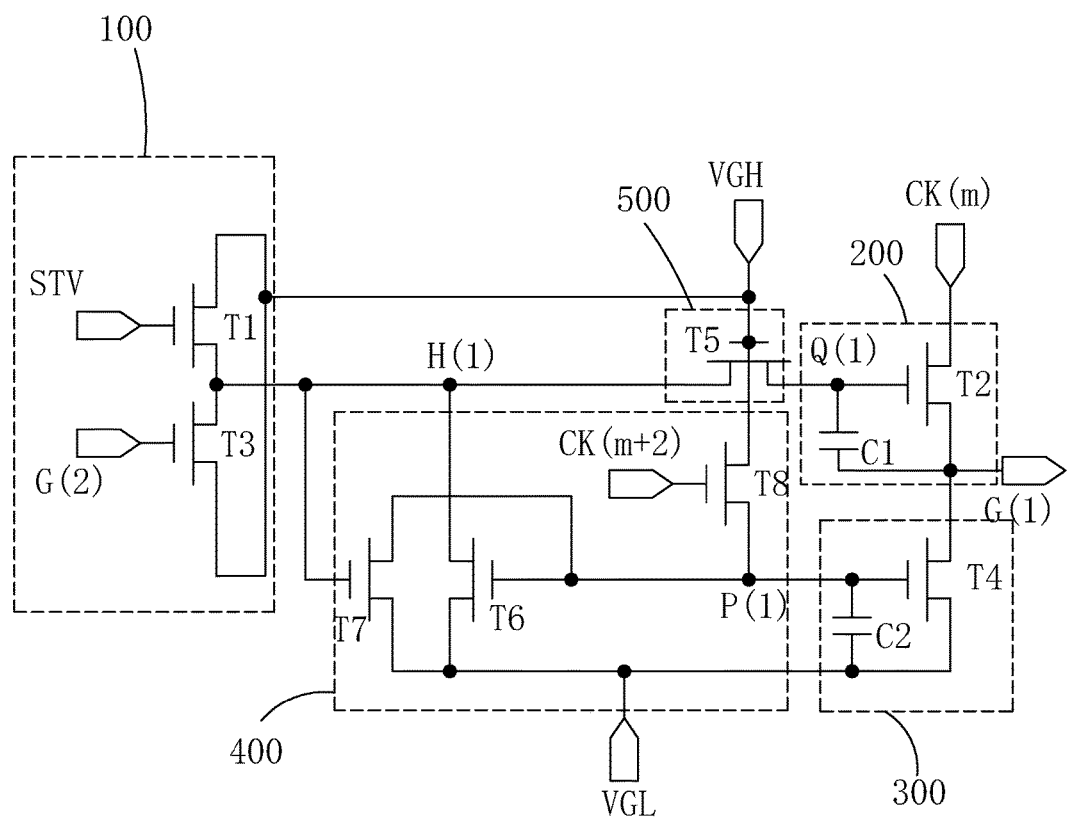
FIG. 3 is a schematic view showing the first-stage GOA unit provided by an embodiment of the present invention.
Figure 4:
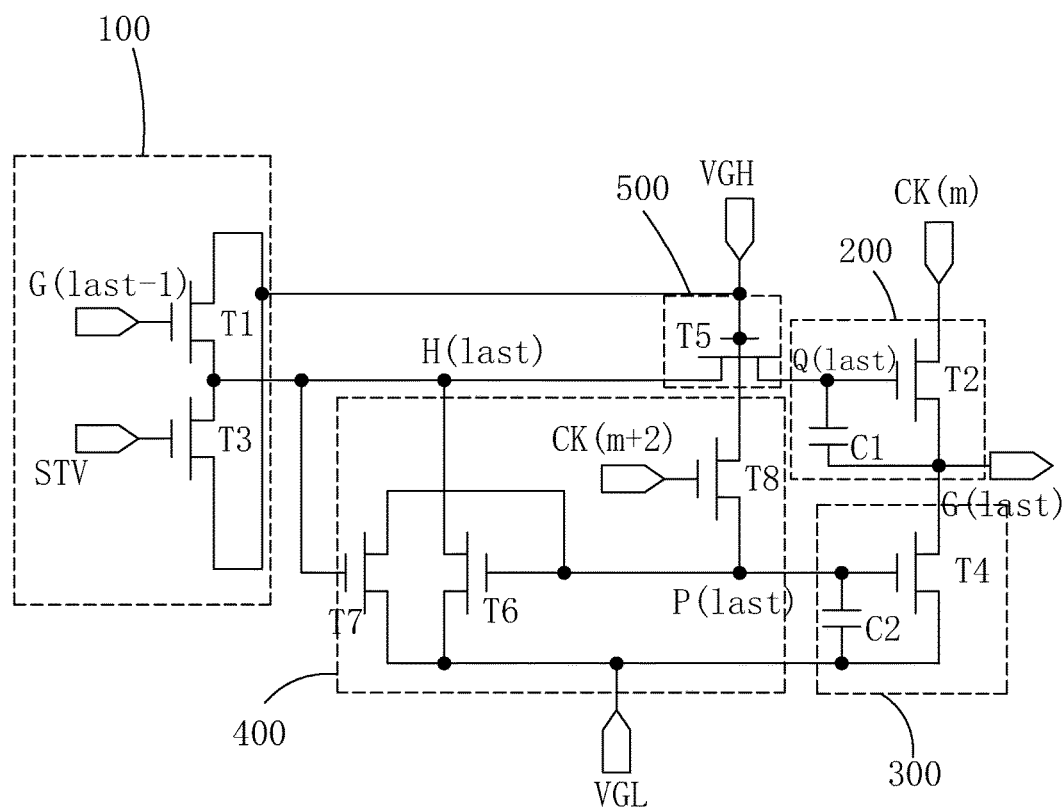
FIGS. 4 is a schematic view showing the last-stage GOA unit provided by an embodiment of the present invention.

Specifically, refer to FIG. 3. In the first-stage GOA unit, the gate of the first TFT T1 is connected to a circuit activation signal STV. Refer to FIG. 4. In the last-stage GOA unit, the gate of the third TFT T3 is connected to the circuit activation signal STV.

It should be noted that the clock signals comprise four clock signals: a first clock signal, a second clock signal, a third clock signal and a fourth clock signal, when the m-th clock signal CK(m) is the third clock signal, the (m+2)-th clock signal CK(m+2) is the first signal; and when the m-th clock signal CK(m) is the fourth clock signal, the (m+2)-th clock signal CK(m+2) is the second signal.

Specifically, the first, second, third and fourth clock signals have the same pulse cycle, and the falling edge of a previous clock signal is generated simultaneously with the rising edge of a next clock signal. In other words, the first pulse signal of the first clock signal is generated first. The moment the first pulse signal of the first clock signal ends, the first pulse signal of the second clock signal is generated. The moment the first pulse signal of the second clock signal ends, the first pulse signal of the third clock signal is generated. The moment the first pulse signal of the third clock signal ends, the first pulse signal of the fourth clock signal is generated. The moment the first pulse signal of the fourth clock signal ends, the second pulse signal of the first clock signal is generated, and so on.

Optionally, all the TFTs are of the N-type TFT, or of the P-type TFT. When all the TFTs are of the N-type TFT, the first constant voltage is a constant high voltage VGH, and the second constant voltage is a constant low voltage VGL. When all the TFTs are of the P-type TFT, the first constant voltage is a constant low voltage VGL, and the second constant voltage is a constant high voltage VGH. In FIG. 2, all the TFTs are of N-type.

Optionally, all the TFTs can be selected from the types of the amorphous silicon (a-Si) TFTs, low temperature poly-silicon (LTPS) TFTs, or oxide semiconductor TFTs.

Figure 5:
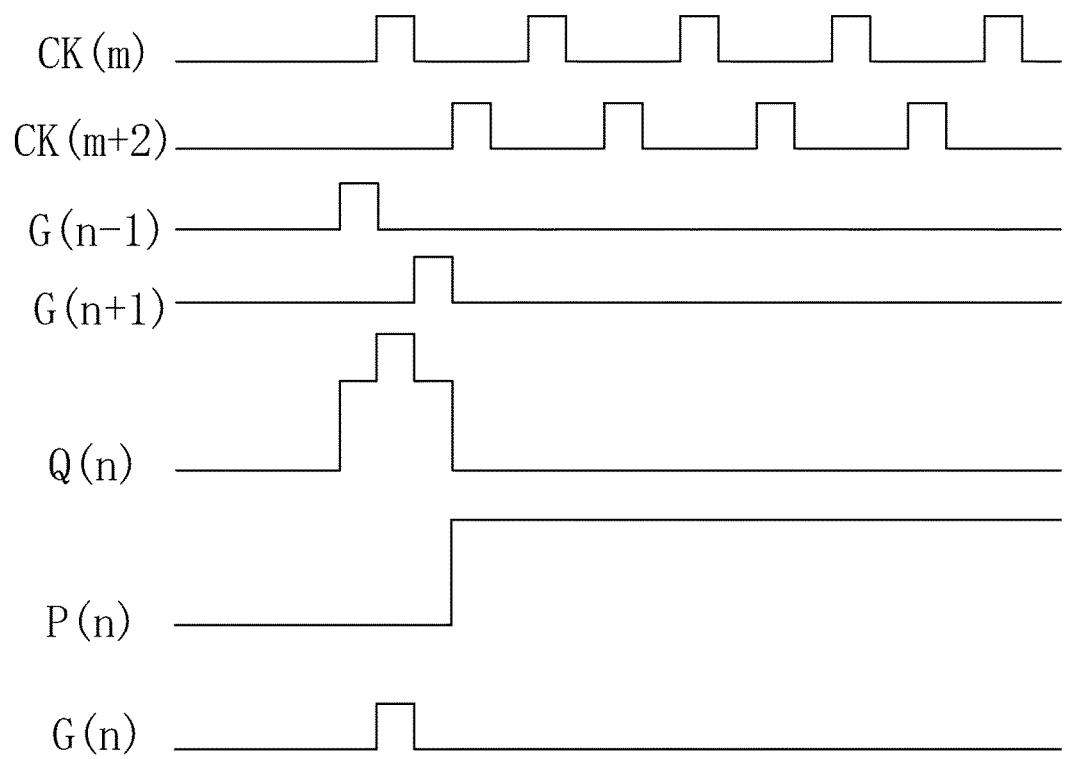
FIG. 5 is a schematic view showing the forward scanning timing for GOA circuit provided by an embodiment of the present invention.

Refer to FIG. 5. During forward scanning, the operation of the GOA circuit (of N-type TFTs) is as follows:

Phase 1, pre-charging phase: the gate scan drive signal G(n-1) of the (n-1)-th GOA unit is high, the first TFT T1 is conductive, the first node H(n) is pre-charged to high level, the seventh TFT T7 is conductive, the third node is pulled down to the constant low voltage VGL, the fifth TFT T5 controlled by the constant high voltage VGH stays conductive, and the second node Q(n) is also pre-charged to high level.

Phase 2, phase of gate scan drive signal G(n) outputting high: in this phase, the gate scan drive signal G(n−1) of the (n−1)-th GOA unit becomes low, the first TFT T1 is turned off, the second node Q(n) stays high under the holding effect of the first capacitor C1, the second TFT T2 is conductive, the m-th clock signal CK(m) provides a high level, the gate scan drive signal G(n) outputs a high level and propagates to the gate of the first TFT T1 of the (n+1)-th GOA unit to achieve cascade propagation of forward scanning.

Phase 3, phase of gate scan drive signal G(n) outputting low: in this phase, the second node Q(n) stays high under the holding effect of the first capacitor C1, the second TFT T2 is conductive, and the low level of the m-th clock signal is outputted from the gate scan drive signal G(n).

Phase 4, phase of pulling down second node Q(n): in this phase, the (m+2)-th clock signal CK(m+2) provides a high level, the eighth TFT T8 is conductive, the third node P(n) is charged to high level, the sixth TFT T6 is conductive, and the first node H(n) and the second node Q(n) are both pulled down to the constant low voltage VGL.

Phase 5, phase of second node Q(n) and gate scan driver signal G(n) maintaining low: when the first node H(n) becomes low, the seventh TFT T7 is in a cut-off state; when the (m+2)-th clock signal CK(m+2) jumps to high level, the eighth TFT T8 becomes conductive, and the third node P(n) is charged to high level, the fourth TFT T4 and the sixth TFT T6 are both in the conductive state to ensure the stability of the second node Q(n) and the gate scan driver signal G(n) at low level, and also, the second capacitor C2 provides a holding effect to the third node P(n) staying at high level.

Figure 6:
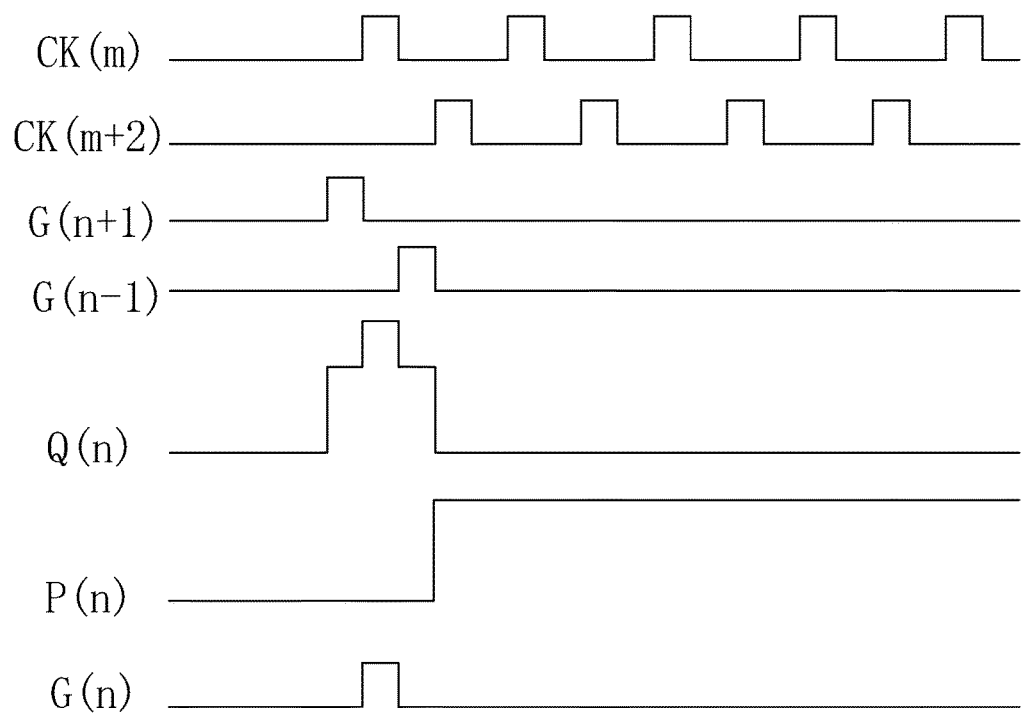
FIG. 6 is a schematic view showing the reverse scanning timing for GOA circuit provided by an embodiment of the present invention.

Correspondingly, refer to FIG. 6. FIG. 6 shows the reverse scanning timing of the GOA circuit of the present invention. The operation differs from the forward scanning in that the reverse scanning uses the third TFT T3 to perform scanning control, and the scanning order is from the last stage to the first last. In other words, the signal outputted by the gate scan drive signal of the next stage GOA unit is propagated to the gate of the third TFT T3 of the previous stage GOA unit to drive the previous stage GOA unit to start outputting. The remaining of the operation is the same as the forward scanning, and will not be repeated here.

As shown, compared to the known technology, the GOA circuit of the present invention does not need the IC to provide the forward scan control signal and the reverse scan control signal, and does not increase the number of TFTs and capacitors, while ensuring the GOA circuit with forward-and-reverse scanning function. As such, the selection of IC for the GOA circuit is increased, which enables the realization of narrow border LCD.

In summary, the present invention provides a GOA circuit, the forward-and-reverse scan control module of the GOA circuit comprising: a first TFT and a third TFT, the first TFT having the gate connected to the gate scan drive signal of the (n−1)-th GOA unit, the source connected to the first constant voltage, and the drain connected to a first node; and the third TFT having the gate connected to the gate scan drive signal of the (n+1)-th GOA unit, the source connected to the first constant voltage, and the drain connected to the first node. With the two TFTs to control the switching of forward and reverse scanning of the GOA circuit, the present invention eliminates two control signals without increasing the numbers of TFTs and capacitors. As such, the selection for IC is increased, which enables the realization of narrow border LCD.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A gate driver on array (GOA) circuit, which comprises: a plurality of cascade GOA units, each GOA unit comprising: a forward-and-reverse scan control module, an output module connected to the forward-and-reverse scan control module, a pull-down module connected to the output module, and a pull-down control module connected to the forward-and-reverse scan control module, the output module and the pull-down module;

for a positive integer n and a positive number m, other than the GOA unit in the first and the last stages, in the n-th GOA unit:

the forward-and-reverse scan control module being connected to receive a gate scan drive signal of the (n−1)-th GOA unit, a gate scan drive signal of the (n+1)-th GOA unit, and a first constant voltage, for outputting the first constant voltage to the output module based on the gate scan drive signal of the (n−1)-th GOA unit or the gate scan drive signal of the (n+1)-th GOA unit to control output module to achieve forward scanning or reverse scanning of the GOA circuit;

the output module outputting an n-th gate scan drive signal during an operation duration of the n-th GOA unit;

the pull-down module pulling down the voltage level of the n-th gate scan drive signal during a non-operation duration of the n-th GOA unit; and the pull-down control module shutting down the pull-down module and maintaining the output module turned on during the operation duration of the n-th GOA unit, and turning on the pull-down module and shutting down the output module during the non-operation duration of the n-th GOA unit;

wherein the forward-and-reverse scan control module comprises: a first thin film transistor (TFT), with the gate connected to the gate scan drive signal of the (n−1)-th GOA unit, the source connected to the first constant voltage, and the drain connected to a first node; and a third TFT, with the gate connected to the gate scan drive signal of the (n+1)-th GOA unit, the source connected to the first constant voltage, and the drain connected to the first node;

the output module comprises: a second TFT, with the gate connected to a second node, the source connected to an m-th clock signal, and the drain connected to the gate scan drive signal of the n-th GOA unit; and a first capacitor, with one end connected to the second node and the other end connected to the gate scan drive signal of the n-th GOA unit;

the pull-down module comprises: a fourth TFT, with the gate connected to a third node, the source connected to the gate scan drive signal of the n-th GOA unit, and the drain connected to a second constant voltage; and a second capacitor, with one end connected to the third node and the other end connected to the second constant voltage; and the pull-down control module comprises: a sixth TFT, with the gate connected to the third node, the source connected to the first node, and the drain connected to the second constant voltage; a seventh TFT, with the gate connected to the first node, the source connected to the third node, and the drain connected to the second constant voltage; and an eighth TFT, with the gate connected to the (m+2)-th clock signal, the source connected to the first constant voltage, and the drain connected to the third node; and the GOA unit further comprises a regulator module, which comprising a fifth TFT, with the gate connected to the first constant voltage, the source connected to the first node, and the drain connected to the second node;

wherein the first constant voltage and the second constant voltage having opposite voltage levels.

2. The GOA circuit as claimed in claim 1, wherein in the first-stage GOA unit, the gate of the first TFT is connected to a circuit activation signal.

3. The GOA circuit as claimed in claim 1, wherein in the last-stage GOA unit, the gate of the third TFT is connected to a circuit activation signal.

4. The GOA circuit as claimed in claim 1, wherein the clock signals comprise four clock signals: a first clock signal, a second clock signal, a third clock signal and a fourth clock signal, when the m-th clock signal is the third clock signal, the (m+2)-th clock signal is the first signal; and when the m-th clock signal is the fourth clock signal, the (m+2)-th clock signal is the second signal.

5. The GOA circuit as claimed in claim 4, wherein the first, second, third and fourth clock signals have the same pulse cycle, and the falling edge of a previous clock signal is generated simultaneously with the rising edge of a next clock signal.

6. The GOA circuit as claimed in claim 1, wherein all the TFTs are of the N-type TFTs, the first constant voltage is a constant high voltage, and the second constant voltage is a constant low voltage.

7. The GOA circuit as claimed in claim 1, wherein all the TFTs are of the P-type TFTs, the first constant voltage is a constant low voltage, and the second constant voltage is a constant high voltage.

8. The GOA circuit as claimed in claim 1, wherein all the TFTs are of the amorphous silicon (a-Si) TFTs, low temperature polysilicon (LTPS) TFTs, or oxide semiconductor TFTs.

9. A gate driver on array (GOA) circuit, which comprises: a plurality of cascade GOA units, each GOA unit comprising: a forward-and-reverse scan control module, an output module connected to the forward-and-reverse scan control module, a pull-down module connected to the output module, and a pull-down control module connected to the forward-and-reverse scan control module, the output module and the pull-down module;

for a positive integer n and a positive number m, other than the GOA unit in the first and the last stages, in the n-th GOA unit:

the forward-and-reverse scan control module being connected to receive a gate scan drive signal of the (n−1)-th GOA unit, a gate scan drive signal of the (n+1)-th GOA unit, and a first constant voltage, for outputting the first constant voltage to the output module based on the gate scan drive signal of the (n−1)-th GOA unit or the gate scan drive signal of the (n+1)-th GOA unit to control output module to achieve forward scanning or reverse scanning of the GOA circuit;

the output module outputting an n-th gate scan drive signal during an operation duration of the n-th GOA unit;

the pull-down module pulling down the voltage level of the n-th gate scan drive signal during a non-operation duration of the n-th GOA unit; and the pull-down control module shutting down the pull-down module and maintaining the output module turned on during the operation duration of the n-th GOA unit, and turning on the pull-down module and shutting down the output module during the non-operation duration of the n-th GOA unit;

the forward-and-reverse scan control module comprising: a first thin film transistor (TFT), with the gate connected to the gate scan drive signal of the (n−1)-th GOA unit, the source connected to the first constant voltage, and the drain connected to a first node; and a third TFT, with the gate connected to the gate scan drive signal of the (n+1)-th GOA unit, the source connected to the first constant voltage, and the drain connected to the first node;

the output module comprising: a second TFT, with the gate connected to a second node, the source connected to an m-th clock signal, and the drain connected to the gate scan drive signal of the n-th GOA unit; and a first capacitor, with one end connected to the second node and the other end connected to the gate scan drive signal of the n-th GOA unit;

the pull-down module comprising: a fourth TFT, with the gate connected to a third node, the source connected to the gate scan drive signal of the n-th GOA unit, and the drain connected to a second constant voltage; and a second capacitor, with one end connected to the third node and the other end connected to the second constant voltage; and the pull-down control module comprising: a sixth TFT, with the gate connected to the third node, the source connected to the first node, and the drain connected to the second constant voltage; a seventh TFT, with the gate connected to the first node, the source connected to the third node, and the drain connected to the second constant voltage; and an eighth TFT, with the gate connected to the (m+2)-th clock signal, the source connected to the first constant voltage, and the drain connected to the third node;

the GOA unit further comprising a regulator module, which comprising a fifth TFT, with the gate connected to the first constant voltage, the source connected to the first node, and the drain connected to the second node;

wherein the first constant voltage and the second constant voltage having opposite voltage levels;

wherein in the first-stage GOA unit, the gate of the first TFT being connected to a circuit activation signal;

wherein in the last-stage GOA unit, the gate of the third TFT being connected to a circuit activation signal;

wherein all the TFTs being of the amorphous silicon (a-Si) TFTs, low temperature polysilicon (LTPS) TFTs, or oxide semiconductor TFTs.

10. The GOA circuit as claimed in claim 9, wherein the clock signals comprise four clock signals: a first clock signal, a second clock signal, a third clock signal and a fourth clock signal, when the m-th clock signal is the third clock signal, the (m+2)-th clock signal is the first signal; and when the m-th clock signal is the fourth clock signal, the (m+2)-th clock signal is the second signal.

11. The GOA circuit as claimed in claim 10, wherein the first, second, third and fourth clock signals have the same pulse cycle, and the falling edge of a previous clock signal is generated simultaneously with the rising edge of a next clock signal.

12. The GOA circuit as claimed in claim 9, wherein all the TFTs are of the N-type TFTs, the first constant voltage is a constant high voltage, and the second constant voltage is a constant low voltage.

13. The GOA circuit as claimed in claim 9, wherein all the TFTs are of the P-type TFTs, the first constant voltage is a constant low voltage, and the second constant voltage is a constant high voltage.

\* \* \* \* \*